US012684824B2

(12) United States Patent
Lavric et al.

(10) Patent No.: US 12,684,824 B2
(45) Date of Patent: Jul. 14, 2026

(54) INTEGRATED CIRCUITS WITH SELF-ALIGNED TUB ARCHITECTURE

(71) Applicant: Intel Corporation, Santa Clara, CA (US)

(72) Inventors: Dan S. Lavric, Beaverton, OR (US); YenTing Chiu, Portland, OR (US); Mohit K. Haran, Hillsboro, OR (US); Allen B. Gardiner, Portland, OR (US); Leonard P. Guler, Hillsboro, OR (US); Andy Chih-Hung Wei, Yamhill, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 430 days.

(21) Appl. No.: 17/561,589

(22) Filed: Dec. 23, 2021

(65) Prior Publication Data

US 2023/0207704 A1      Jun. 29, 2023

(51) Int. Cl.
| | |
|---|---|
| *H10D 30/83* | (2025.01) |
| *H10D 30/69* | (2025.01) |
| *H10D 30/80* | (2025.01) |

(52) U.S. Cl.
CPC ........... *H10D 30/83* (2025.01); *H10D 30/721* (2025.01); *H10D 30/801* (2025.01)

(58) Field of Classification Search
CPC ............. H10D 84/014; H10D 84/0158; H10D 84/0177; H10D 84/038; H10D 84/83; H10D 84/834; H10D 84/85; H10D 84/853; H10D 86/215; H10D 30/6215; H10D 30/0217; H10D 30/02; H10D 84/0193; H10D 30/6728; H10D 30/6733;

H10D 30/6735; H10D 62/118; H10D 89/931; H10D 64/252; H10D 84/0188; H10D 84/201; H10D 18/60; H10D 30/62–6219; H10D 30/024–0245; H10D 86/011; H10D 84/856; H10D 30/014; H10D 30/43; H10D 62/121; H10D 84/0167; H10D 88/01; H10D 84/0151; H10D 30/6757; H10D 30/031; H10D 48/362; H10D 30/472; H10D 30/6713; H10D 30/01; H10D 30/673; H10D 62/80; H10D 62/8303; H10D 62/882; H10D 99/00; H10D 62/235; H10D 89/10;
(Continued)

(56) References Cited

U.S. PATENT DOCUMENTS

2019/0305104 A1* 10/2019 Xie .................... H10D 30/6757
2019/0348516 A1* 11/2019 Ramaswamy ....... H10D 84/038
(Continued)

FOREIGN PATENT DOCUMENTS

DE      102021104073      11/2021

OTHER PUBLICATIONS

Partial Search Report from European Patent Application No. 22214741. 5, mailed Jul. 20, 2023, 14 pgs.
(Continued)

*Primary Examiner* — Moin M Rahman
(74) *Attorney, Agent, or Firm* — Schwabe, Williamson & Wyatt, P.C.

(57) ABSTRACT

Embodiments of the disclosure are directed to advanced integrated circuit structure fabrication and, in particular, to integrated circuits with self-aligned tub architectures. Other embodiments may be described or claimed.

11 Claims, 11 Drawing Sheets

(58) Field of Classification Search
CPC .............. H10D 84/0128; H10D 62/292; H01L
21/02068; H01L 21/32134; H01L
21/32136; H01L 21/32137; H01L
21/3213; H01L 21/0228; H01L 21/76224;
H01L 21/02164; H01L 21/0217; H01L
21/0332; H01L 21/823437; H01L
21/823475; H01L 24/16; H01L 29/7842;
H01L 29/7853; H01L 2224/16227; H01L
24/32; H01L 24/73; H01L 2224/32225;
H01L 2224/73204; H01L 23/485; H02K
15/027; A23B 2/783; A45C 11/003;
A61K 40/4218; H10F 77/955; H10H
20/826; B82Y 10/00; H10B 12/36; H10B
12/056
See application file for complete search history.

(56) References Cited

U.S. PATENT DOCUMENTS

| | | | | |
|---|---|---|---|---|
| 2020/0006569 A1* | 1/2020 | Reznicek | ............. | H10D 62/121 |
| 2020/0052116 A1* | 2/2020 | Kim | ................... | H10D 84/0193 |
| 2020/0105891 A1* | 4/2020 | Lilak | ................. | H10D 84/0186 |
| 2021/0091179 A1 | 3/2021 | Wang | | |
| 2021/0098457 A1* | 4/2021 | Cheng | ................... | H10D 84/83 |

OTHER PUBLICATIONS

Search Report from European Patent Application No. 22214741.5, mailed Oct. 24, 2023, 13 pgs.

* cited by examiner

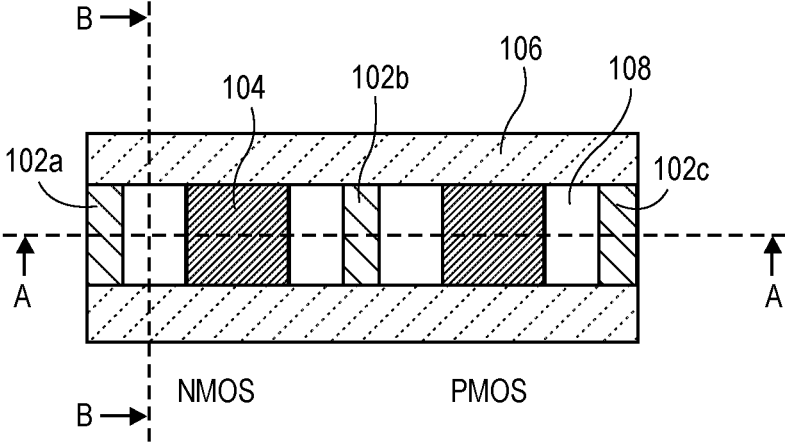
FIG. 1A-1
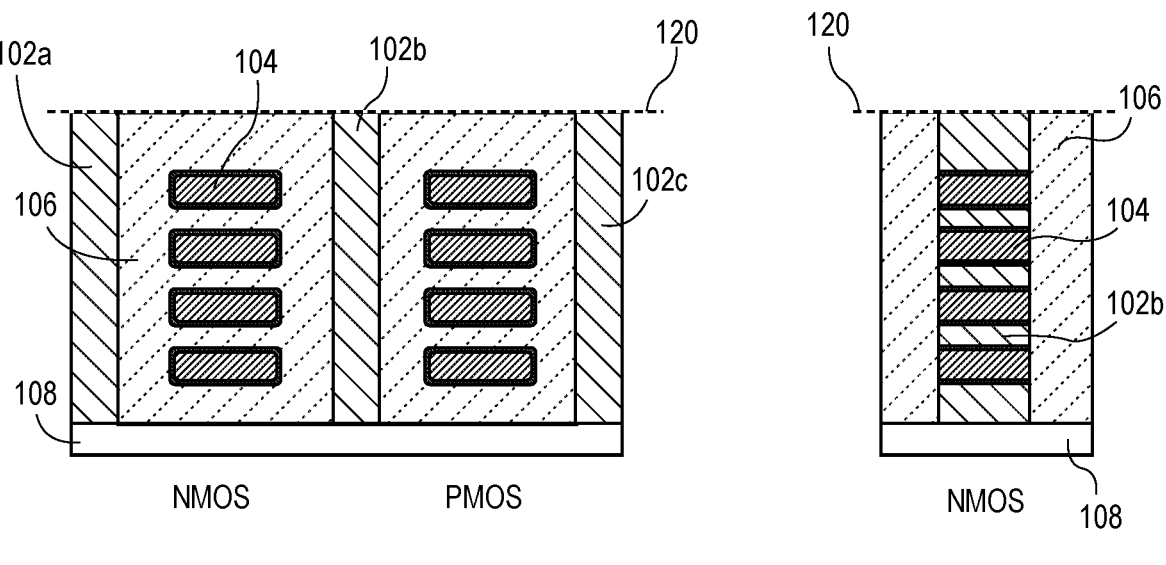
FIG. 1A-2          FIG. 1A-3

NMOS        PMOS

NMOS        PMOS

NMOS　　　　　PMOS

INTEGRATED CIRCUITS WITH SELF-ALIGNED TUB ARCHITECTURE

TECHNICAL FIELD

Embodiments of the disclosure are in the field of advanced integrated circuit structure fabrication and, in particular, integrated circuits with self-aligned tub architectures.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

In some devices, for example, conventional metal gate (MG) patterning breaks down for tight poly end caps (e.g., <10-12 nm) for regular gates or gates with fixed poly end caps and short self-aligned walls due to a tri-layer etch critical dimension (TLE CD) in an open region being much smaller than the critical carbon hard mask (CHM) CD that TLE Patterning can successfully etch down to the bottom of the gate.

Additionally, traditional TLE MG patterning tends to damage the top ribbon that is exposed to dry etch chemistry, thereby affecting overall transistor performance. There are also CD scaling limitations for TLE dry etch (e.g., critical CHM) when patterning traditional MG layers, such as work function metal (WFM) or dipoles that are deposited before TLE. Embodiments of the present disclosure address these and other issues.

BRIEF DESCRIPTION OF THE DRAWINGS

FIGS. 1A-1, 1A-2, and 1A-3 are cross-sectional views of an integrated circuit (IC) structure, in accordance with various embodiments of the present disclosure.

FIGS. 1B-1 through 1B-9 are cross-sectional views illustrating a process for manufacturing an IC, in accordance with various embodiments of the present disclosure.

FIGS. 1C-1 through 1C-4 are cross-sectional views illustrating another process for manufacturing an IC, in accordance with various embodiments of the present disclosure.

FIG. 2 illustrates an example of a computing device in accordance with various embodiments of the disclosure.

FIG. 3 illustrates an example of an interposer that includes one or more embodiments of the disclosure.

DESCRIPTION OF THE EMBODIMENTS

Figures 1, 1B:
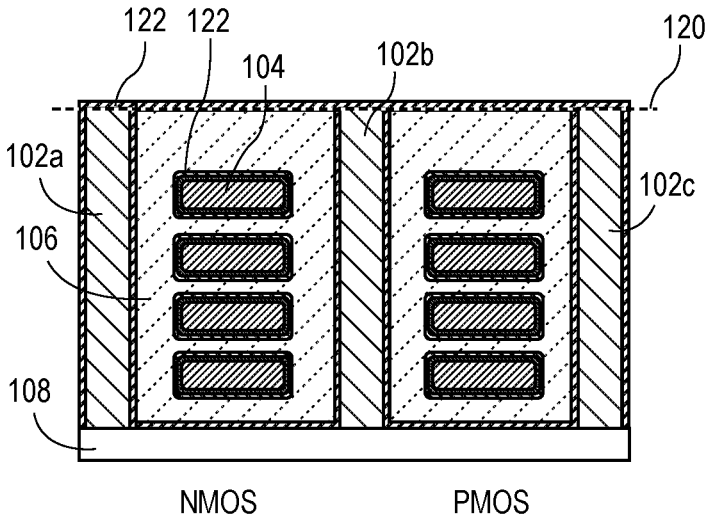

In some embodiments, integrated circuits with self-aligned tub architectures are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions or context for terms found in this disclosure (including the appended claims):

"Comprising." This term is open-ended. As used in the appended claims, this term does not foreclose additional structure or operations.

"Configured To." Various units or components may be described or claimed as "configured to" perform a task or tasks. In such contexts, "configured to" is used to connote structure by indicating that the units or components include structure that performs those task or tasks during operation. As such, the unit or component can be said to be configured to perform the task even when the specified unit or component is not currently operational (e.g., is not on or active). Reciting that a unit or circuit or component is "configured to" perform one or more tasks is expressly intended not to invoke 35 U.S.C. § 112, sixth paragraph, for that unit or component.

"First," "Second," etc. As used herein, these terms are used as labels for nouns that they precede, and do not imply any type of ordering (e.g., spatial, temporal, logical, etc.).

"Coupled"—The following description refers to elements or nodes or features being "coupled" together. As used herein, unless expressly stated otherwise, "coupled" means that one element or node or feature is directly or indirectly joined to (or directly or indirectly communicates with) another element or node or feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation or location or both of portions of the component within a consistent but arbitrary frame of reference which is made clear by reference to the text and the associated drawings describing the component under discussion. Such terminology may include the words specifically mentioned above, derivatives thereof, and words of similar import.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, or effect which might otherwise occur. Accordingly, when a component, element, or feature is referred to as inhibiting a result or state, it need not completely prevent or eliminate the result or state.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back-end-of-line (BEOL) semiconductor processing and structures. BEOL is the second portion of IC fabrication where the individual devices (e.g., transistors, capacitors, resistors, etc.) get interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments may be implemented to realize a 3D ferroelectric RAM (FRAM, FeRAM, or F-RAM) to potentially increase monolithic integration of backend logic plus memory in SoCs of future technology nodes. To provide context, a FRAM is a random-access memory similar in construction to DRAM but uses a ferroelectric layer instead of a dielectric layer to achieve non-volatility. Conventionally, both FRAM and DRAM are one transistor (1T)/one capacitor (1C) cell arrays, where each cell comprises an access transistor in the front end coupled to a single capacitor. The capacitor may be coupled to a bitline (COB) higher in the stack in the semiconductor back end.

As introduced above, conventional MG patterning and TLE MG patterning pose a number of issues in semiconductor manufacturing. Additionally, regular gates experience a TLE break down for tight poly end cap (EC) with a similar size as the edge placement error (EPE), also a TLE breaks down for very small gates (e.g., CD≤10 nm) even for thin patterned layers (e.g., ≤2 nm). Conventional solutions utilizing a short self-aligned gate wall between transistors likewise experience a TLE break down for tight poly EC with a similar size as the EPE.

Embodiments of the present disclosure, by contrast, utilize a self-aligned gate wall that extends from the gate bottom to the gate top in a height equal to other gate walls in the device. The self-aligned gate wall is disposed in between each of the NMOS or PMOS devices, effectively creating "tub" gates for each device. Among other things, these tub gates enable a novel self-aligned metal gate patterning by using a TLE that stops on a sacrificial dielectric layer (SDL) that has been previously deposited to fill the gates, polished at the gate top level and recessed shallow.

In embodiments of the present disclosure, TLE patterning can be skewed towards an open region such that, irrespective of the EPE, the pattern always lands either on the gate wall or on the open region (that is, self-aligned to the device). A wet etch may subsequently clear the SDL in the open region, rendering metal gate patterning successful. A patterned layer may be subsequently etched by a wet etch process in the open region while being protected by the CHM and SDL in the block region of the pattern.

The proposed self-aligned MG patterning enabled by the tub gates successfully patterns gate architectures with very narrow gate CD, very tight poly EC and very tight N-P spacing that otherwise cannot be patterned using conventional patterning methods. It additionally does so without any top ribbon damage enabling further scaling of library cell heights for future process nodes characterized by tighter gate CD, and smaller poly EC and N-P spacing.

FIGS. 1A-1, 1A-2, and 1A-3 illustrate a top view, fin cut view (along A-A), and gate cut view (along B-B) of an integrated circuit structure in accordance with various embodiments. In this example, the device illustrates 1N1P (1 NMOS transistor, 1 PMOS transistor) tub gates. In these examples, the IC structure includes an n-channel metal oxide semiconductor (NMOS) transistor and a p-channel metal oxide semiconductor (PMOS) transistor with a bottom gate layer 108. The IC structure includes a first gate wall 102a coupled to the bottom gate layer 108, a second gate wall 102b coupled to the bottom gate layer 108, and a third gate wall 102c coupled to the bottom gate layer 108. The NMOS transistor is disposed between the first gate wall 102a and the second gate wall 102b, while the PMOS transistor is disposed between the second gate wall 102b and the third gate wall 102c.

The NMOS transistor comprises a first plurality of silicon nano-ribbons 104 and the PMOS transistor comprises a second plurality of silicon nano-ribbons 104. A gate spacer material 106 is formed between the silicon nano-ribbons 104 and, gate walls 102a, 102b, 102c, and the bottom gate layer 108.

As illustrated in FIGS. 1A-1 through 1A-3, the gate walls 102a, 102b, 102c each have a same/common height from the bottom gate layer 108. The top edges of walls 102a, 102b, and 102c define the gate top 120. In some previous conventional solutions, the gate wall between the NMOS and PMOS devices (gate 102b in this example) is shorter than outer walls 102b, 102c, leading to damage to the top-most silicon nano-ribbons 104 from TLE processing, as well as an inability to fully remove the CHM from the NMOS device during processing.

FIGS. 1B-1 through 1B-9 illustrate processing steps for the 1N1P tub gate structure shown in FIGS. 1A-1 through 1A-3 to result in the device structure shown in FIGS. 1B-9. In FIGS. 1B-1, a work function metal (WFM) layer or dipole layer 122 is deposited as shown. A sacrificial dielectric layer (SDL) 125 fills the gate (FIGS. 1B-2) and is then polished (FIGS. 1B-3). Shallow recesses 130 are formed in the SDL layer 125 (FIGS. 1B-4) and a carbon hard mask (CHM) 135 applied (FIG. 1B-5). In FIG. 1B-5, a self-aligned N-block mask (NBM) is patterned with a 1×EPE offset with respect to the outer edges of walls 102b and 102c. TLE patterning opens CHM 135 to expose PMOS device and lands on recessed SDL 130 rather than on the bottom of the gate 108, with no TLE damage to the silicon nano-ribbons 104.

In FIGS. 1B-6, an SDL wet etch removal process is performed to selectively remove the SDL 125 from the PMOS device through open region 130. WFM or dipole layer 122 is exposed in PMOS device as displayed by arrow 140. In FIGS. 1B-7, illustrated by arrow 142, another wet etch removal process is used to remove substantially all of the WFM layer or dipole layer 122. The CHM 135 is ashed (removed) in FIGS. 1B-8, and an SDL wet etch removal process performed in NMOS (FIGS. 1B-9) resulting in a device that includes the WFM or dipole layer 122 coupled to the silicon nano-ribbons 104 of the NMOS device and to the interior portions of the first and second gate walls 102a, 102b as shown. The nano-ribbons 104 of the PMOS device, by contrast, are free from the WFM or dipole layer 122, as are the interiors of the second gate wall 102b and third gate wall 102c forming the "tub" for the PMOS device.

While the examples in FIGS. 1A-1 through 1A-3 and 1B-1 through 1B-9 illustrate a 1N1P device, embodiments of the present disclosure may be applied to any suitable number of devices. For example, FIGS. 1C-1 through 1C-4 illustrate a process for manufacturing a 2N2P tub gate device.

In this example, a first NMOS transistor N-LVT (low voltage threshold) is disposed between the first gate wall 102a and second gate wall 102b. A second NMOS transistor N-SVT (standard voltage threshold) is disposed between the second gate wall 102b and a third gate wall 102c. A first PMOS transistor P-LVT is disposed between the third gate wall 102c and a fourth gate wall 150, while a second PMOS transistor P-SVT is disposed between the fourth gate wall 150 and a fifth gate wall 155. As with the 1N1P device in the previous examples, all five gate walls in this example have a same/common height, with the gate top 120 defined by the top edges of the gate walls.

Figures 1, 1B, 2:
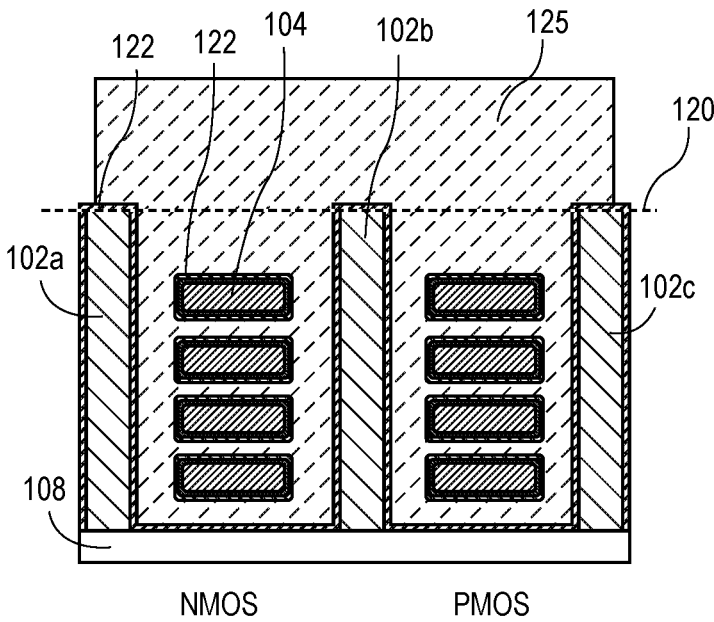
Figures 1, 1B, 2, 3:
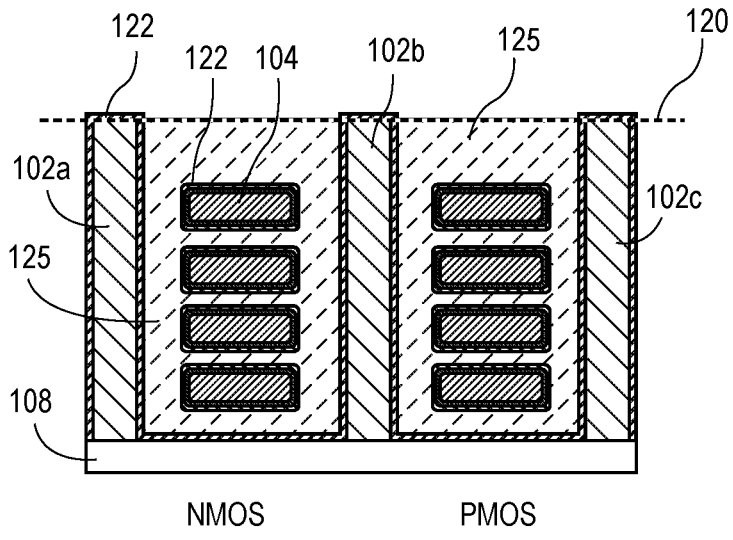
Figures 1, 1B, 2, 3, 4:
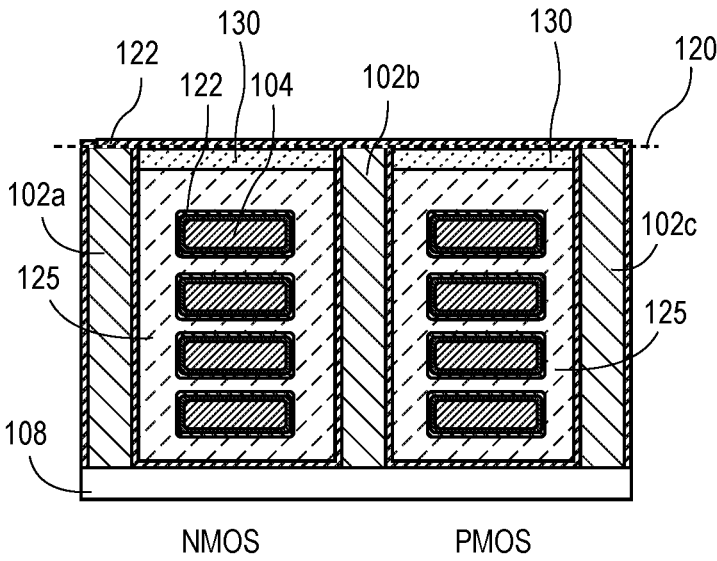
Figures 1, 1B, 2, 3, 4, 5:
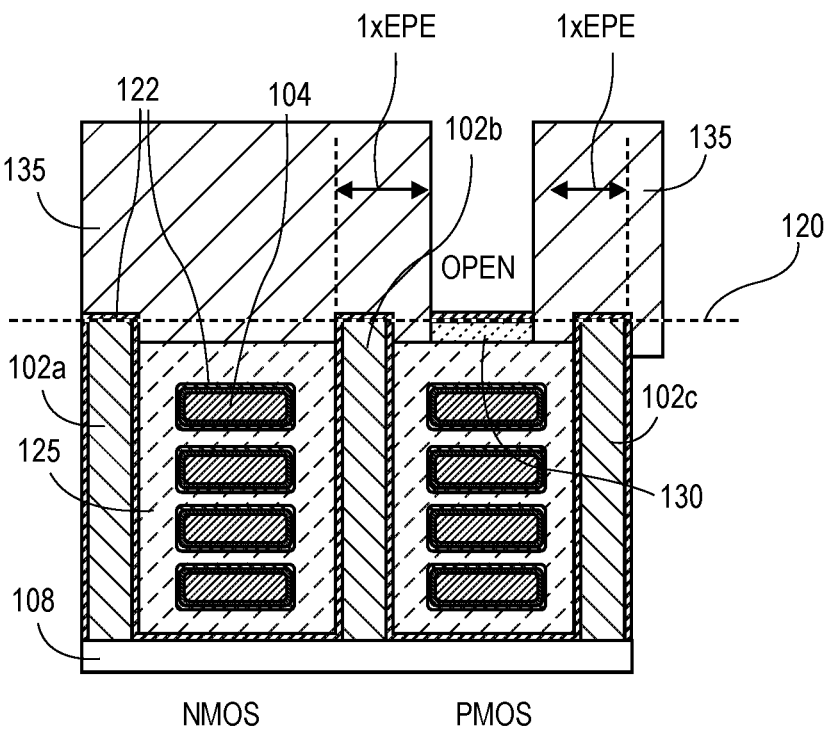
Figures 1, 1B, 2, 3, 4, 5, 6:
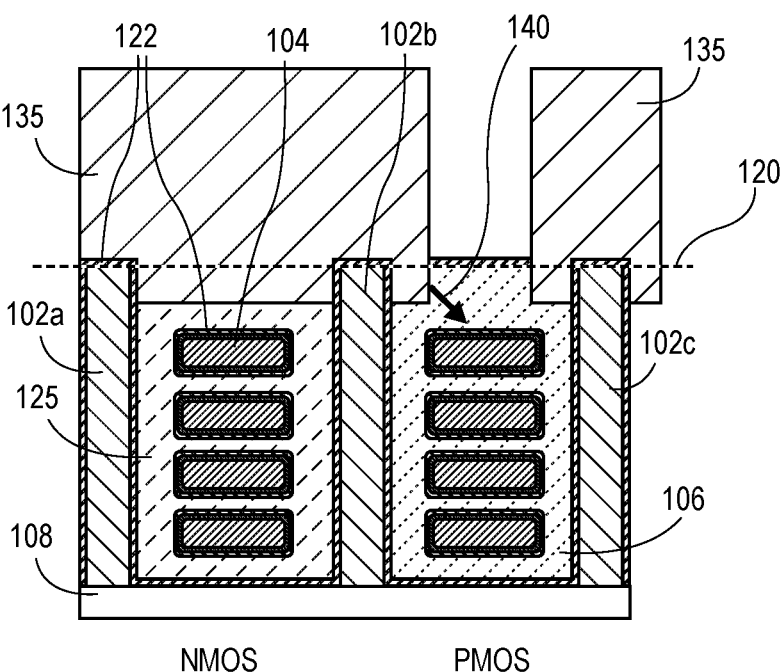
Figures 1, 1B, 2, 3, 4, 5, 6, 7:
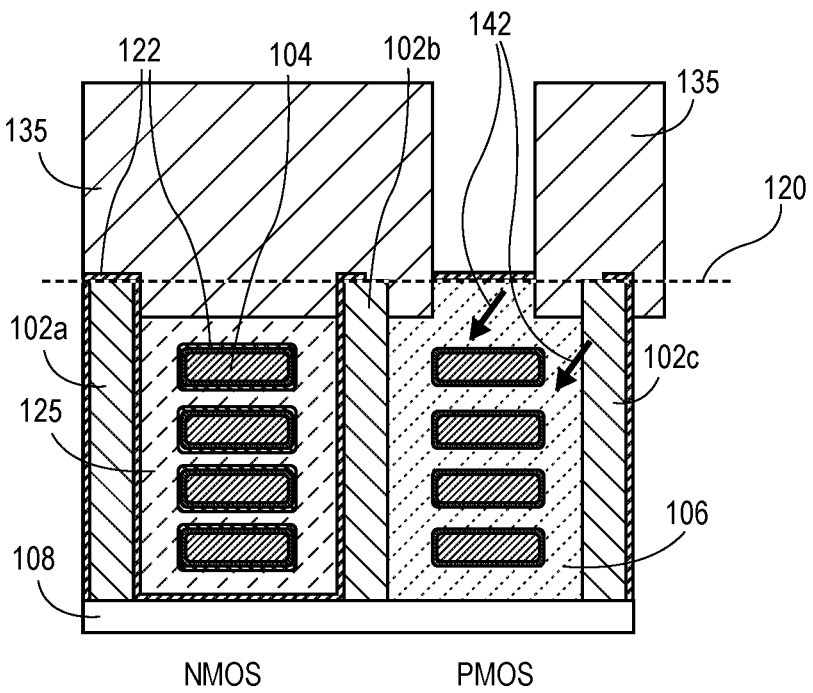
Figures 1, 1B, 2, 3, 4, 5, 6, 7, 8:
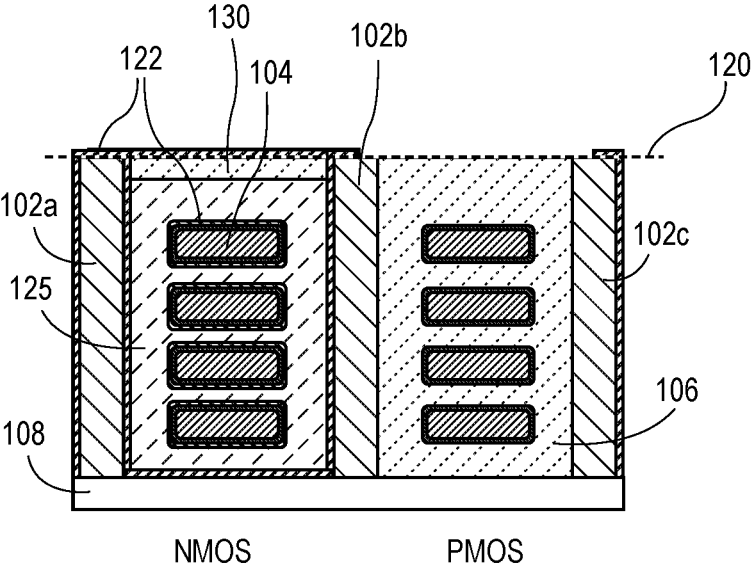
Figures 1, 1B, 2, 3, 4, 5, 6, 7, 8, 9:
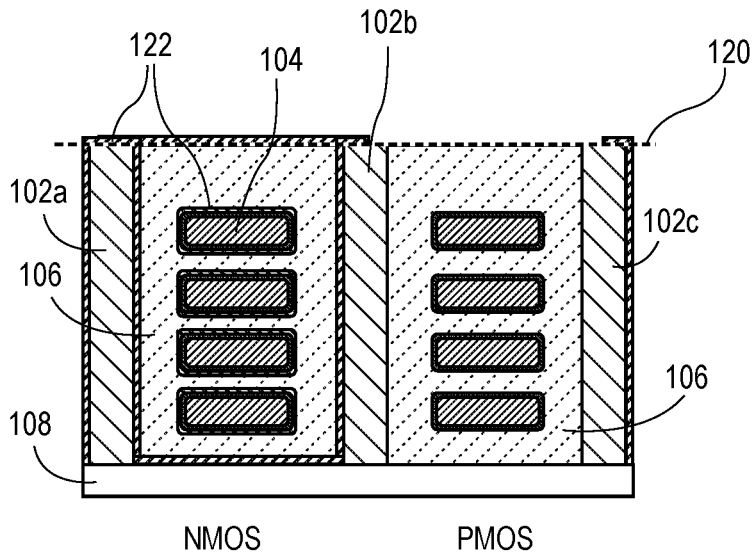
Figures 1, 1C:
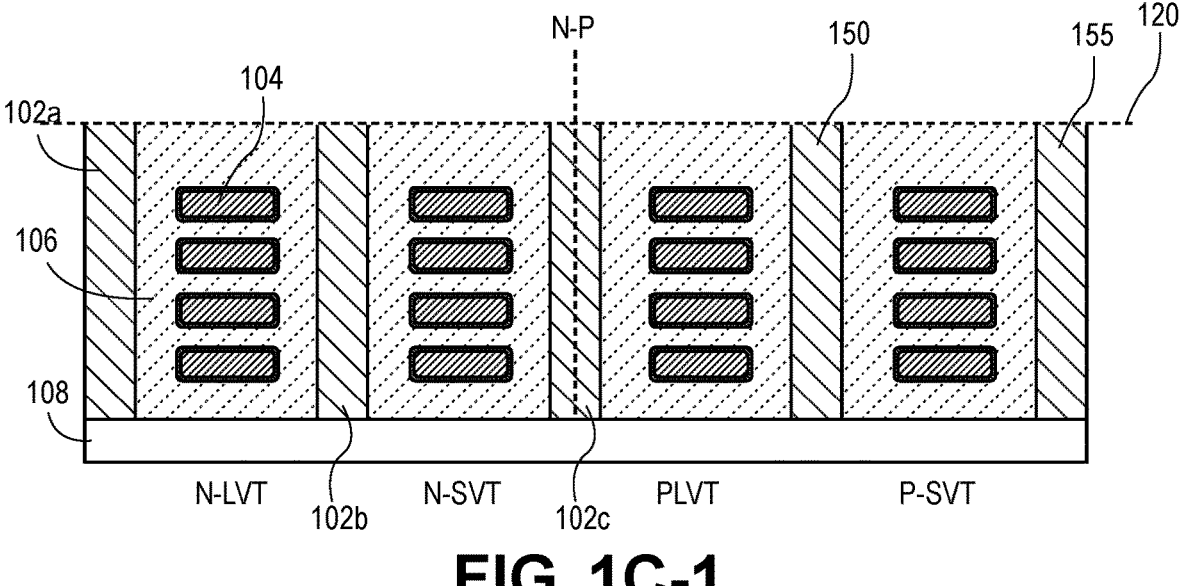
Figures 1, 1C, 2:
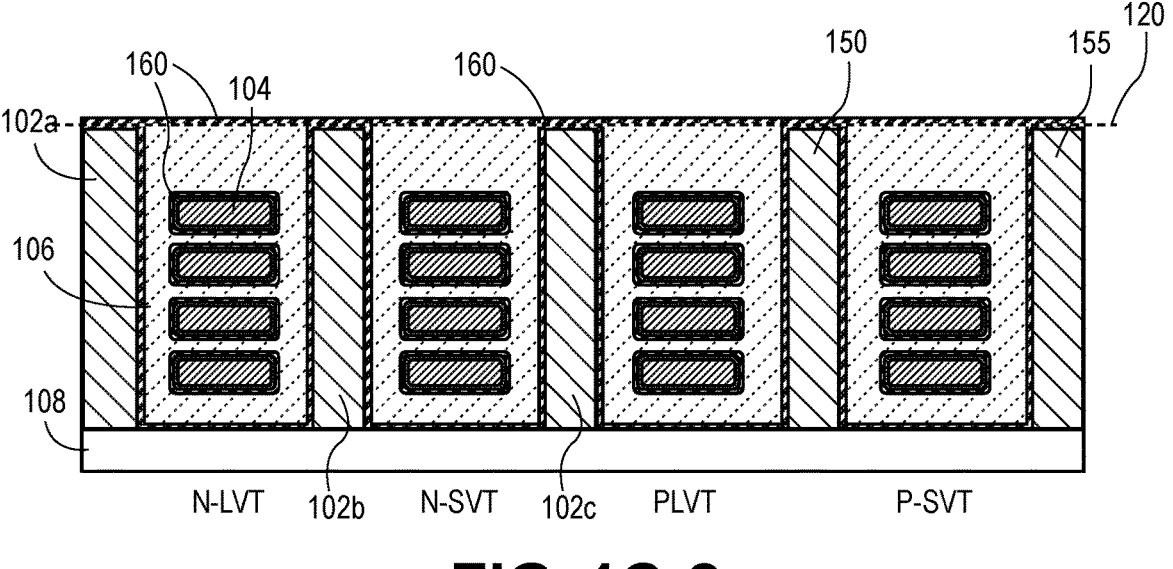
Figures 1, 1C, 2, 3:
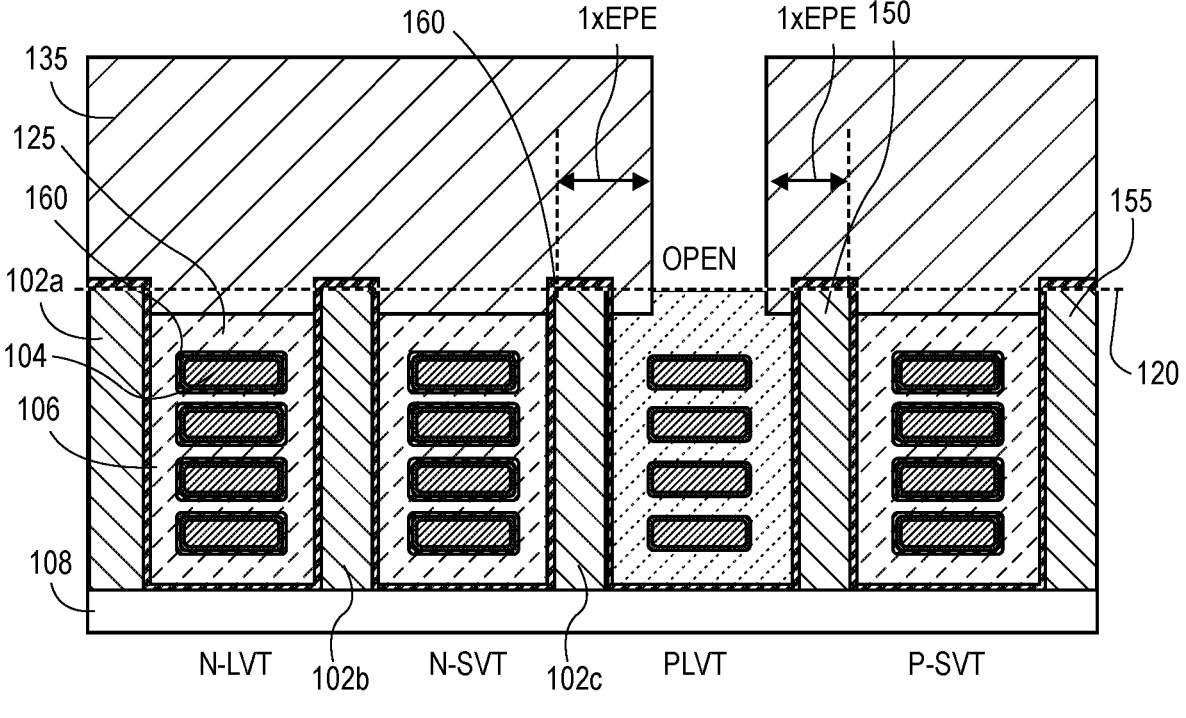
Figures 1, 1C, 2, 3, 4:
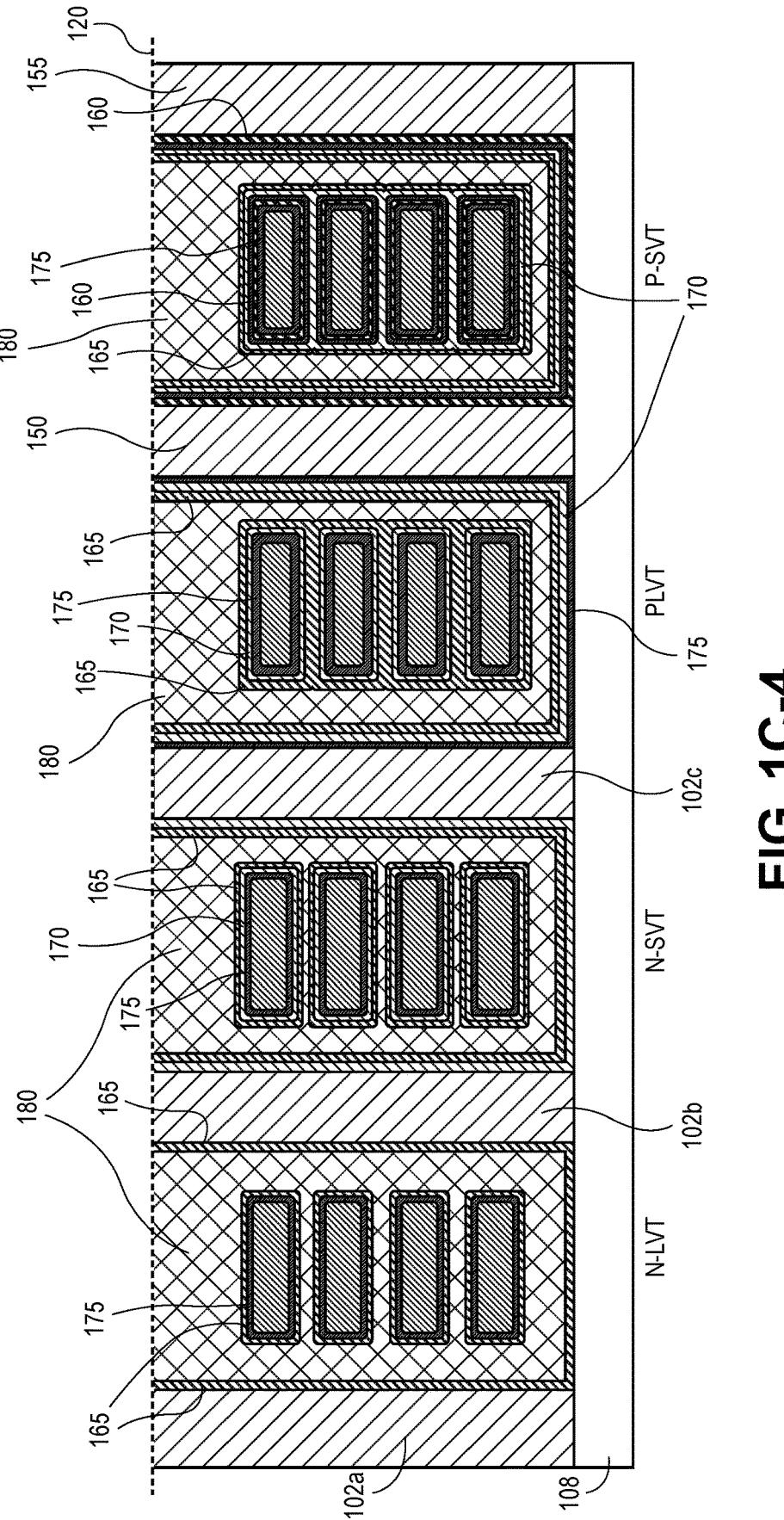
Figure 2:
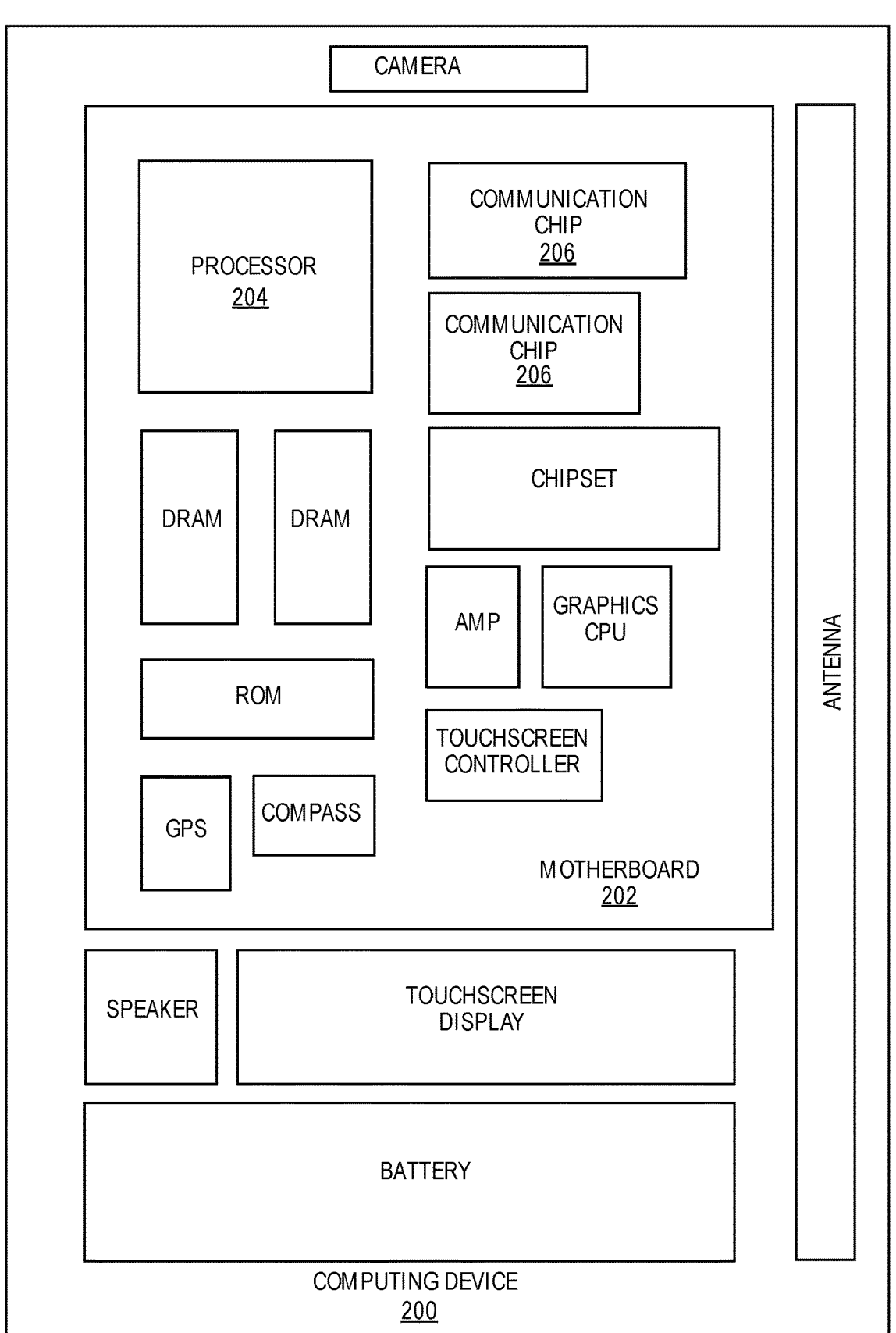
Figure 3:
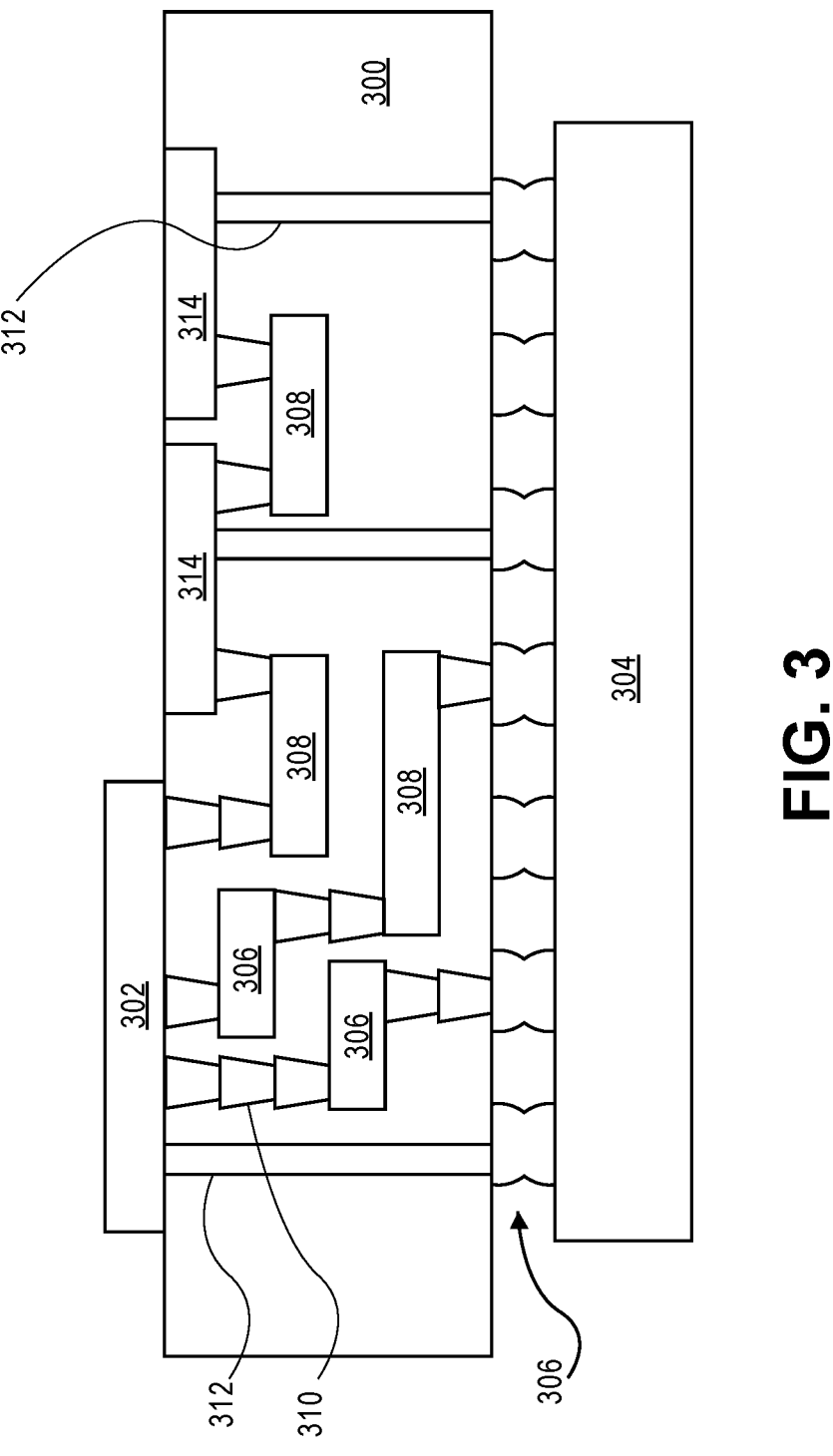

FIG. 1C-2 illustrates the deposition of a first WFM or dipole layer 160, while FIG. 1C-3 provides an example of the removal of the first WFM or dipole layer 160 and corresponding SDL 125 from the P-LVT transistor through the open region using a wet etch removal process similar to that described above. The process steps illustrated above with reference to 1B-1 and 1B-2 are repeated for the N-SVT and N-LVT gates to selectively deposit and remove additional layers 165 and 170. Finally, an WFM or dipole layer 175, free of any additional patterning, is deposited on all gates. FIG. 1C-4 illustrates that the N-LVT device has 175, N-SVT has 170+175, P-LVT has 165+170+175 and P-SVT has 160+165+170+175. Also, FIG. 1C-4 displays the addition of a gate fill material 180.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, tungsten, and/or conductive metal nitrides such as TiN, VN, WN and NbN. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide HfC, zirconium carbide ZrC, titanium carbide TiC, tantalum carbide TaC, and aluminum carbide, or carbides of the alloys of these metals such as HfAlC, ZrAlC TiAlC and TaAlC. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

FIG. 2 illustrates a computing device 200 in accordance with one implementation of the invention. The computing device 200 houses a board 202. The board 202 may include a number of components, including but not limited to a processor 204 and at least one communication chip 206. The processor 204 is physically and electrically coupled to the board 202. In some implementations the at least one communication chip 206 is also physically and electrically coupled to the board 202. In further implementations, the communication chip 206 is part of the processor 204.

Depending on its applications, computing device 200 may include other components that may or may not be physically and electrically coupled to the board 202. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 206 enables wireless communications for the transfer of data to and from the computing device 200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 206 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 200 may include a plurality of communication chips 206. For instance, a first communication chip 206 may be dedicated to shorter range wireless communications such as Wi-Fi and Bluetooth and a second communication chip 206 may be dedicated to longer range wireless communications such as GPS, EDGE, GPRS, CDMA, WiMAX, LTE, Ev-DO, and others.

The processor 204 of the computing device 200 includes an integrated circuit die packaged within the processor 204. In some implementations of the invention, the integrated circuit die of the processor 204 includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 206 also includes an integrated circuit die packaged within the communication chip 206. In accordance with another implementation of the invention, the integrated circuit die of the communication chip 206 includes one or more devices, such as MOS-FET transistors built in accordance with implementations of the invention.

In further implementations, another component housed within the computing device 200 may contain an integrated circuit die that includes one or more devices, such as MOS-FET transistors built in accordance with implementations of the invention.

In various implementations, the computing device 200 may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 200 may be any other electronic device that processes data.

FIG. 3 illustrates an interposer 300 that includes one or more embodiments of the invention. The interposer 300 is an intervening substrate used to bridge a first substrate 302 to a second substrate 304. The first substrate 302 may be, for instance, an integrated circuit die. The second substrate 304 may be, for instance, a memory module, a computer motherboard, or another integrated circuit die. Generally, the purpose of an interposer 300 is to spread a connection to a wider pitch or to reroute a connection to a different connection. For example, an interposer 300 may couple an integrated circuit die to a ball grid array (BGA) 306 that can subsequently be coupled to the second substrate 304. In some embodiments, the first and second substrates 302/304 are attached to opposing sides of the interposer 300. In other embodiments, the first and second substrates 302/304 are attached to the same side of the interposer 300. And in further embodiments, three or more substrates are interconnected by way of the interposer 300.

The interposer 300 may be formed of an epoxy resin, a fiberglass-reinforced epoxy resin, a ceramic material, or a polymer material such as polyimide. In further implementations, the interposer 300 may be formed of alternate rigid or flexible materials that may include the same materials described above for use in a semiconductor substrate, such as silicon, germanium, and other group III-V and group IV materials.

The interposer 300 may include metal interconnects 308 and vias 310, including but not limited to through-silicon vias (TSVs) 312. The interposer 300 may further include embedded devices 314, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 300. In accordance with embodiments of the invention, apparatuses or processes disclosed herein may be used in the fabrication of interposer 300.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

Example embodiment 1 includes an integrated circuit structure, comprising: an n-channel metal oxide semiconductor (NMOS) transistor; a p-channel metal oxide semiconductor (PMOS) transistor; a bottom gate layer; a first gate wall coupled to the bottom gate layer; a second gate wall coupled to the bottom gate layer; and a third gate wall coupled to the bottom gate layer, wherein the NMOS transistor is disposed between the first gate wall and the second gate wall, the PMOS transistor is disposed between the second gate wall and the third gate wall, and the first, second, and third gate walls have a common height from the bottom gate layer.

Example embodiment 2 includes the integrated circuit structure of example embodiment 1 or some other example herein, wherein NMOS transistor comprises a first plurality of silicon nano-ribbons and the PMOS transistor comprises a second plurality of silicon nano-ribbons.

Example embodiment 3 includes the integrated circuit structure of example embodiment 2 or some other example herein, further comprising a gate spacer material between the first plurality of silicon nano-ribbons and: the first gate wall, the second gate wall, and the bottom gate layer.

Example embodiment 4 includes the integrated circuit structure of example embodiment 2 or some other example herein, further comprising a gate spacer material between the second plurality of silicon nano-ribbons and: the second gate wall, the third gate wall, and the bottom gate layer.

Example embodiment 5 includes the integrated circuit structure of example embodiment 1 or some other example herein, further comprising a work function metal (WFM) layer or dipole layer coupled to the first plurality of silicon nano-ribbons.

Example embodiment 6 includes the integrated circuit structure of example embodiment 5 or some other example herein, wherein the WFM layer or dipole layer is further coupled to at least a portion of the first gate wall and the second gate wall.

Example embodiment 7 includes the integrated circuit structure of example embodiment 5 or some other example herein, wherein there is no WFM layer or dipole layer coupled to the second plurality of silicon nano-ribbons or the third gate wall.

Example embodiment 8 includes an integrated circuit structure, comprising: a first n-channel metal oxide semiconductor (NMOS) transistor; a second NMOS transistor; a first p-channel metal oxide semiconductor (PMOS) transistor; a second PMOS transistor; a bottom gate layer; a first gate wall coupled to the bottom gate layer; a second gate wall coupled to the bottom gate layer; a third gate wall coupled to the bottom gate layer; a third gate wall coupled to the bottom gate layer; and a fifth gate wall coupled to the bottom gate layer, wherein the first NMOS transistor is disposed between the first gate wall and the second gate wall, the second NMOS transistor is disposed between the second gate wall and the third gate wall, the first PMOS transistor is disposed between the third gate wall and the fourth gate wall, the second PMOS transistor is disposed between the fourth gate wall and the fifth gate wall, and the first, second, third, fourth, and fifth gate walls have a common height from the bottom gate layer.

Example embodiment 9 includes the integrated circuit structure of example embodiment 8 or some other example herein, wherein first NMOS transistor comprises a first plurality of silicon nano-ribbons and the second NMOS transistor comprises a second plurality of silicon nano-ribbons.

Example embodiment 10 includes the integrated circuit structure of example embodiment 9 or some other example herein, further comprising a gate spacer material between the first plurality of silicon nano-ribbons and: the first gate wall, the second gate wall, and the bottom gate layer.

Example embodiment 11 includes the integrated circuit structure of example embodiment 9 or some other example herein, further comprising a gate spacer material between the second plurality of silicon nano-ribbons and: the second gate wall, the third gate wall, and the bottom gate layer.

Example embodiment 12 includes the integrated circuit structure of example embodiment 8 or some other example herein, further comprising a work function metal (WFM) layer or dipole layer coupled to the first plurality of silicon nano-ribbons and the second plurality of silicon nano-ribbons.

Example embodiment 13 includes the integrated circuit structure of example embodiment 12 or some other example herein, wherein the WFM layer or dipole layer is further coupled to at least a portion of: the first gate wall, second gate wall, third gate wall, and fourth gate wall.

Example embodiment 14 includes the integrated circuit structure of example embodiment 13 or some other example herein, wherein the WFM layer or dipole layer is a first WFM layer or dipole layer, and wherein a second WFM layer or dipole layer is coupled to the first WFM layer or dipole layer.

Example embodiment 15 includes the integrated circuit structure of example embodiment 14 or some other example herein, wherein the first PMOS transistor comprises a third plurality of silicon nano-ribbons and the second PMOS transistor comprises a fourth plurality of silicon nano-ribbons, wherein the first WFM layer or dipole layer is coupled to the third and fourth plurality of silicon nano-ribbons and at least a portion of the fourth and fifth gate walls, and the second WFM layer or dipole layer is coupled to the first WFM layer or dipole layer.

Example embodiment 16 includes the integrated circuit structure of example embodiment 15 or some other example herein, wherein a third WFM layer or dipole layer is coupled to the second WFM layer or dipole layer that is coupled to the third and fourth plurality of silicon nano-ribbons and the at least a portion of the fourth and fifth gate walls.

Example embodiment 17 includes the integrated circuit structure of example embodiment 16 or some other example herein, wherein a fourth WFM layer or dipole layer is coupled to the third WFM layer or dipole layer that is coupled to the third and fourth plurality of silicon nano-ribbons and the at least a portion of the fourth and fifth gate walls.

Example embodiment 18 includes a computing device, comprising: a board; and a component coupled to the board, the component including an integrated circuit structure, comprising: an n-channel metal oxide semiconductor (NMOS) transistor; a p-channel metal oxide semiconductor (PMOS) transistor; a bottom gate layer; a first gate wall coupled to the bottom gate layer; a second gate wall coupled to the bottom gate layer; and a third gate wall coupled to the bottom gate layer, wherein the NMOS transistor is disposed between the first gate wall and the second gate wall, the PMOS transistor is disposed between the second gate wall and the third gate wall, and the first, second, and third gate walls have a common height from the bottom gate layer.

Example embodiment 19 includes the computing device of example embodiment 18 or some other example herein, further comprising: a processor coupled to the board, a communication chip coupled to the board, or a camera coupled to the board.

Example embodiment 20 includes a computing device, comprising: a board; and a component coupled to the board, the component including an integrated circuit structure, comprising: a first n-channel metal oxide semiconductor (NMOS) transistor; a second NMOS transistor; a first p-channel metal oxide semiconductor (PMOS) transistor; a second PMOS transistor; a bottom gate layer; a first gate wall coupled to the bottom gate layer; a second gate wall coupled to the bottom gate layer; a third gate wall coupled to the bottom gate layer; a third gate wall coupled to the bottom gate layer; and a fifth gate wall coupled to the bottom gate layer, wherein the first NMOS transistor is disposed between the first gate wall and the second gate wall, the second NMOS transistor is disposed between the second gate wall and the third gate wall, the first PMOS transistor is disposed between the third gate wall and the fourth gate wall, the second PMOS transistor is disposed between the fourth gate wall and the fifth gate wall, and the first, second, third, fourth, and fifth gate walls have a common height from the bottom gate layer.

Example embodiment 21 includes the computing device of example embodiment 20 or some other example herein, further comprising: a processor coupled to the board, a communication chip coupled to the board, or a camera coupled to the board.

What is claimed is:

1. An integrated circuit structure, comprising:
an n-channel metal oxide semiconductor (NMOS) transistor having a gate stack, wherein NMOS transistor comprises a first plurality of silicon nano-ribbons;
a p-channel metal oxide semiconductor (PMOS) transistor having a gate stack, wherein the PMOS transistor comprises a second plurality of silicon nano-ribbons;
a bottom gate layer;
a first gate wall coupled to the bottom gate layer;
a second gate wall coupled to the bottom gate layer;
a third gate wall coupled to the bottom gate layer, wherein the gate stack of the NMOS transistor is disposed between and is in contact with the first gate wall and the second gate wall, the gate stack of the PMOS transistor is disposed between and is in contact with the second gate wall and the third gate wall, and the first, second, and third gate walls have a common height from the bottom gate layer; and
a work function metal (WFM) layer or dipole layer coupled to the first plurality of silicon nano-ribbons, wherein the WFM layer or dipole layer is further coupled to at least a portion of the first gate wall and the second gate wall.

2. The integrated circuit structure of claim 1, wherein there is no WFM layer or dipole layer coupled to the second plurality of silicon nano-ribbons or the third gate wall.

3. An integrated circuit structure, comprising:
a first n-channel metal oxide semiconductor (NMOS) transistor having a gate stack, wherein first NMOS transistor comprises a first plurality of silicon nano-ribbons;
a second NMOS transistor having a gate stack, wherein the second NMOS transistor comprises a second plurality of silicon nano-ribbons;
a first p-channel metal oxide semiconductor (PMOS) transistor having a gate stack;
a second PMOS transistor having a gate stack;
a bottom gate layer;
a first gate wall coupled to the bottom gate layer;
a second gate wall coupled to the bottom gate layer;
a third gate wall coupled to the bottom gate layer;
a fourth gate wall coupled to the bottom gate layer;
a fifth gate wall coupled to the bottom gate layer, wherein the gate stack of the first NMOS transistor is disposed between and is in contact with the first gate wall and the second gate wall, the gate stack of the second NMOS transistor is disposed between and is in contact with the second gate wall and the third gate wall, the gate stack of the first PMOS transistor is disposed between and is in contact with the third gate wall and the fourth gate wall, the gate stack of the second PMOS transistor is disposed between and is in contact with the fourth gate wall and the fifth gate wall, and the first, second, third, fourth, and fifth gate walls have a common height from the bottom gate layer; and a work function metal (WFM) layer or dipole layer coupled to the first plurality of silicon nano-ribbons and the second plurality of silicon nano-ribbons, wherein the WFM layer or dipole layer is further coupled to at least a portion of one of: the first gate wall, the second gate wall, the third gate wall, or the fourth gate wall.

4. The integrated circuit structure of claim 3, wherein the WFM layer or dipole layer is a first WFM layer or dipole layer, and wherein a second WFM layer or dipole layer is coupled to the first WFM layer or dipole layer.

5. The integrated circuit structure of claim 4, wherein the first PMOS transistor comprises a third plurality of silicon nano-ribbons and the second PMOS transistor comprises a fourth plurality of silicon nano-ribbons, wherein the first WFM layer or dipole layer is coupled to the third and fourth plurality of silicon nano-ribbons and at least a portion of the fourth and fifth gate walls, and the second WFM layer or dipole layer is coupled to the first WFM layer or dipole layer.

6. The integrated circuit structure of claim 5, wherein a third WFM layer or dipole layer is coupled to the second WFM layer or dipole layer that is coupled to the third and fourth plurality of silicon nano-ribbons and the at least a portion of the fourth and fifth gate walls.

7. The integrated circuit structure of claim 6, wherein a fourth WFM layer or dipole layer is coupled to the third WFM layer or dipole layer that is coupled to the third and fourth plurality of silicon nano-ribbons and the at least a portion of the fourth and fifth gate walls.

8. A computing device, comprising:

a board; and a component coupled to the board, the component including an integrated circuit structure, comprising:

an n-channel metal oxide semiconductor (NMOS) transistor having a gate stack, wherein NMOS transistor comprises a first plurality of silicon nano-ribbons;

a p-channel metal oxide semiconductor (PMOS) transistor having a gate stack, wherein the PMOS transistor comprises a second plurality of silicon nano-ribbons;

a bottom gate layer;

a first gate wall coupled to the bottom gate layer;

a second gate wall coupled to the bottom gate layer;

a third gate wall coupled to the bottom gate layer, wherein the gate stack of the NMOS transistor is disposed between and is in contact with the first gate wall and the second gate wall, the gate stack of the PMOS transistor is disposed between and is in contact with the second gate wall and the third gate wall, and the first, second, and third gate walls have a common height from the bottom gate layer; and a work function metal (WFM) layer or dipole layer coupled to the first plurality of silicon nano-ribbons, wherein the WFM layer or dipole layer is further coupled to at least a portion of the first gate wall and the second gate wall.

9. The computing device of claim 8, further comprising: a processor coupled to the board, a communication chip coupled to the board, or a camera coupled to the board.

10. A computing device, comprising:

a board; and a component coupled to the board, the component including an integrated circuit structure, comprising:

a first n-channel metal oxide semiconductor (NMOS) transistor having a gate stack, wherein first NMOS transistor comprises a first plurality of silicon nano-ribbons;

a second NMOS transistor having a gate stack, wherein the second NMOS transistor comprises a second plurality of silicon nano-ribbons;

a first p-channel metal oxide semiconductor (PMOS) transistor having a gate stack;

a second PMOS transistor having a gate stack;

a bottom gate layer;

a first gate wall coupled to the bottom gate layer;

a second gate wall coupled to the bottom gate layer;

a third gate wall coupled to the bottom gate layer;

a fourth gate wall coupled to the bottom gate layer;

a fifth gate wall coupled to the bottom gate layer, wherein the gate stack of the first NMOS transistor is disposed between and is in contact with the first gate wall and the second gate wall, the gate stack of the second NMOS transistor is disposed between and is in contact with the second gate wall and the third gate wall, the gate stack of the first PMOS transistor is disposed between and is in contact with the third gate wall and the fourth gate wall, the gate stack of the second PMOS transistor is disposed between and is in contact with the fourth gate wall and the fifth gate wall, and the first, second, third, fourth, and fifth gate walls have a common height from the bottom gate layer; and a work function metal (WFM) layer or dipole layer coupled to the first plurality of silicon nano-ribbons and the second plurality of silicon nano-ribbons, wherein the WFM layer or dipole layer is further coupled to at least a portion of one of: the first gate wall, the second gate wall, the third gate wall, or the fourth gate wall.

11. The computing device of claim 10, further comprising: a processor coupled to the board, a communication chip coupled to the board, or a camera coupled to the board.

* * * * *